(12) United States Patent
Galatage et al.

(10) Patent No.: US 10,340,146 B2
(45) Date of Patent: Jul. 2, 2019

(54) RELIABILITY CAPS FOR HIGH-K DIELECTRIC ANNEALS

(71) Applicant: GLOBALFOUNDRIES Inc., Grand Cayman (KY)

(72) Inventors: Rohit Galatage, Clifton Park, NY (US); Shariq Siddiqui, Albany, NY (US); Chung-Ju Yang, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/647,495

(22) Filed: Jul. 12, 2017

(65) Prior Publication Data

US 2019/0019682 A1 Jan. 17, 2019

(51) Int. Cl.
| | | |
|---|---|---|
| *H01L 21/00* | (2006.01) | |
| *H01L 21/28* | (2006.01) | |
| *H01L 21/02* | (2006.01) | |
| *H01L 21/311* | (2006.01) | |
| *H01L 29/51* | (2006.01) | |

(52) U.S. Cl.
CPC .... *H01L 21/28211* (2013.01); *H01L 21/0228* (2013.01); *H01L 21/02175* (2013.01); *H01L 21/02181* (2013.01); *H01L 21/02183* (2013.01); *H01L 21/02186* (2013.01); *H01L 21/02189* (2013.01); *H01L 21/02362* (2013.01); *H01L 21/28185* (2013.01); *H01L 21/31111* (2013.01); *H01L 29/517* (2013.01)

(58) Field of Classification Search
CPC ......... H01L 21/28211; H01L 21/02175; H01L 21/02181; H01L 21/02183; H01L 21/02186; H01L 21/02189; H01L 21/0228
See application file for complete search history.

(56) References Cited

U.S. PATENT DOCUMENTS

| | | |
|---|---|---|
| 5,776,823 A | 7/1998 | Agnello et al. |
| 6,355,521 B1 * | 3/2002 | Cho .................. H01L 28/60 257/308 |
| 8,735,987 B1 | 5/2014 | Hoffmann et al. |
| | (Continued) | |

FOREIGN PATENT DOCUMENTS

CN 106449391 A 2/2017

OTHER PUBLICATIONS

Meng et al., "Atomic Layer Deposition of Silicon Nitride Thin Films: A Review of Recent Progress, Challenges, and Outlooks", Materials 2016, 9(12), 1007.

(Continued)

*Primary Examiner* — Richard A Booth
(74) *Attorney, Agent, or Firm* — Thompson Hine LLP; Francois Pagette

(57) ABSTRACT

Structures for reliability caps used in the manufacture of a field-effect transistor and methods for forming reliability caps used in the manufacture of a field-effect transistor. A layer comprised of a metal silicon nitride is deposited on a high-k dielectric material. The high-k dielectric material is thermally processed in an oxygen-containing ambient environment with the layer arranged as a cap between the high-k dielectric material and the ambient environment. Due at least in part to its composition, the layer blocks transport of oxygen from the ambient environment to the high-k dielectric material.

16 Claims, 1 Drawing Sheet

(56) References Cited

U.S. PATENT DOCUMENTS

2002/0195683 A1* 12/2002 Kim .................. H01L 21/28194
257/532
2008/0048276 A1*  2/2008 Jeon .................. H01L 21/28052
257/412
2013/0344692 A1* 12/2013 Triyoso ............... H01L 21/3105
438/591
2017/0125429 A1*  5/2017 Su ..................... H01L 21/28273

OTHER PUBLICATIONS

Lee et al., "Crystallographic-orientation-dependent GIDL current in Tri-gate MOSFETs under hot carrier stress", Microelectronics Reliability, vol. 54, Issues 9-10, Sep.-Oct. 2014, pp. 2315-2318.

* cited by examiner

RELIABILITY CAPS FOR HIGH-K DIELECTRIC ANNEALS

BACKGROUND

The present invention relates to semiconductor device fabrication and integrated circuits and, more specifically, to structures for reliability caps used in the manufacture of a field-effect transistor and methods for forming reliability caps used in the manufacture of a field-effect transistor.

Device structures for a field-effect transistor include a source, a drain, a body arranged between the source and drain, and a gate structure including a gate electrode and a gate dielectric separating the gate electrode from the body. A gate voltage applied to the gate electrode is used to provide switching that selectively connects the source and drain to each other through a channel formed in the body. The channel of a planar field-effect transistor is horizontal and located beneath the top surface of the substrate on which the gate structure is supported. In contrast, the channel of a fin-type field-effect transistor is vertical and located in a semiconductor fin where overlapped by the gate electrode. Other types of field-effect transistors include gate-all-around designs, such as horizontal nanosheet field effect transistors and vertical-transport field-effect transistors.

Either type of field-effect transistor may be formed with a gate structure that incorporates a high-k dielectric material as the gate dielectric and one or more metals as the gate electrode. After the high-k dielectric material is deposited, a series of thermal annealing steps may be performed to improve the reliability of the high-k dielectric material. A reliability cap is applied that operates as a barrier to protect the high-k dielectric material from exposure to oxygen in the ambient atmosphere during the thermal annealing.

Improved structures for reliability caps used in the manufacture of a field-effect transistor and methods for forming reliability caps used in the manufacture of a field-effect transistor are needed.

SUMMARY

In an embodiment of the invention, a method includes depositing a layer comprised of a metal silicon nitride on a high-k dielectric material and thermally processing the high-k dielectric material in an oxygen-containing ambient environment with the layer arranged as a cap between the high-k dielectric material and the ambient environment. Due at least in part to its composition, the layer blocks transport of oxygen from the ambient environment to the high-k dielectric material.

In an embodiment of the invention, a structure is provided for use in thermally processing a high-k dielectric material in an oxygen-containing ambient environment. The layer is arranged between the high-k dielectric material and the oxygen-containing ambient environment as a cap, and the layer is composed of a metal silicon nitride. Due at least in part to its composition, the layer blocks transport of oxygen from the oxygen-containing ambient environment to the high-k dielectric material.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
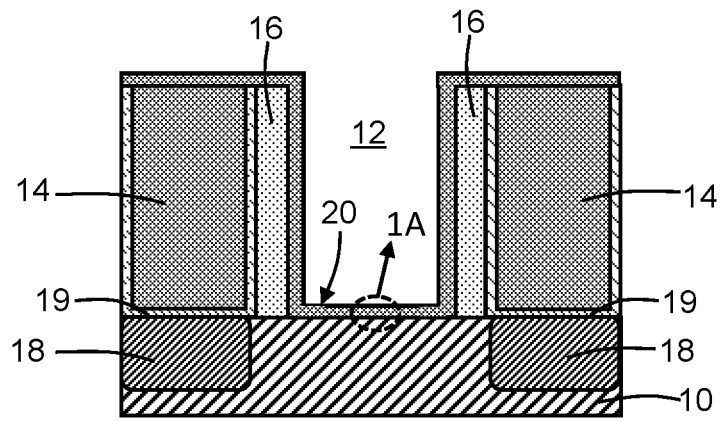
FIG. 1 is a cross-sectional view of a device structure at an initial stage of a processing method in accordance with embodiments of the invention.
Figure 1A:
FIG. 1A is an expanded cross-sectional view of the encircled portion of the device structure of FIG. 1.

With reference to FIGS. 1, 1A and in accordance with embodiments of the invention, a substrate 10 is provided that may be a bulk substrate or a device layer of a semiconductor-on-insulator (SOI) substrate. An opening 12 is formed in an interlayer dielectric layer 14 located on the surface of the substrate 10. The interlayer dielectric layer 14 may be composed of a dielectric material, such as silicon dioxide ($SiO_2$). The opening 12 may be formed in the interlayer dielectric layer 14 as part of a replacement metal gate (RMG) technique in which a sacrificial gate structure is removed to generate the opening 12. The opening 12 includes sidewalls that extend from a top surface of the interlayer dielectric layer 14 to the surface of the substrate 10.

Sidewall spacers 16 may be positioned on the substrate 10 adjacent to the sidewalls of the opening 12 and may define the lateral boundaries of the opening 12. The sidewall spacers 16 may be composed of a dielectric material, such as a low-k dielectric material like silicon oxycarbonitride (SiOCN), deposited as a conformal layer by atomic layer deposition (ALD) and etched with a directional etching process such as reactive ion etching (ME).

Source/drain regions 18 may be arranged adjacent to the opening 12 at respective locations near the top surface of the substrate 10. As used herein, the term "source/drain region" means a doped region of semiconductor material that can function as either a source or a drain of a field-effect transistor. The semiconductor material of the source/drain regions 18 may be doped with an n-type dopant (e.g., phosphorus (P) or arsenic (As)) when forming an n-type field-effect transistor, or may be doped with a p-type dopant when forming a p-type field-effect transistor. The source/drain regions 18 may be formed by, for example, ion implantation. The source/drain regions 18 are covered by a contact etch stop layer (CESL) 19, which may be constituted by a thin layer composed of silicon nitride ($Si_3N_4$).

A layer stack 20 may be conformally formed inside the opening 12 on the sidewalls of the opening 12 and on the substrate 10 at the base of the opening 12, as well as on the field on top of the interlayer dielectric layer 14. The layer stack 20 includes, in sequence of deposition, an interfacial layer 22, a dielectric layer 24, a barrier layer 26, and a blocking layer 28. The barrier layer 26 and blocking layer 28 are elements of a reliability cap that is applied to the dielectric layer 24 after the interfacial layer 22 and dielectric layer 24 are deposited and subjected to a post-deposition anneal. The post-deposition anneal may thicken the material of the interfacial layer 22, and may reduce defects and/or electrical traps in the materials of the interfacial layer 22 and dielectric layer 24. The post-deposition anneal may be performed in an ambient atmosphere that includes nitrogen or ammonia and optionally oxygen, and may be performed by rapid thermal annealing as a spike anneal and/or a soak anneal.

The interfacial layer 22 may be composed of a dielectric layer, such as an oxide layer (e.g., silicon dioxide ($SiO_2$)) grown by thermal oxidation or by wet chemical oxidation with ozonated, deionized water on the top surface of the substrate 10. The interfacial layer 22 may only be present in the layer stack 20 at the interface with the substrate 10 and may be absent on the sidewalls of the opening 12.

The dielectric layer 24 may be composed of a dielectric material, such as a high-k dielectric material like hafnium oxide ($HfO_2$) or hafnium oxynitride (HfON) that has a dielectric constant (e.g., relative permittivity) greater than the dielectric constant of $SiO_2$. The dielectric layer 24 may be deposited by ALD. In an embodiment, the dielectric constant of the dielectric layer 24 may be greater than 3.9.

The barrier layer 26 may be composed of a material, such as a metal nitride like titanium nitride (TiN) or tantalum nitride (TaN), that functions as a diffusion barrier to silicon during subsequent high-temperature anneals. The barrier layer 26 may be in direct contact with the blocking layer 28 along an interface 27.

The blocking layer 28 may be composed of a material that is a metal silicon nitride, such as titanium silicon nitride (TiSiN), as an elemental component. In embodiments, the composition of the metal silicon nitride constituting the blocking layer 28 may include titanium (Ti), tantalum (Ta) tungsten (W), niobium (Nb), vanadium (V), zirconium (Zr), hafnium (Hf), chromium (Cr), molybdenum (Mo), and combinations of these metals. In embodiments, the composition of the blocking layer 28 may include the metal in a range from 20 atomic percent (at. %) to 40 at. %, silicon in a range from 10 at. % to 30 at. %, and nitrogen in a range from 30 at. % to 60 at. %. The blocking layer 28, which may have an amorphous structure, presents a barrier to oxygen diffusion during subsequent high-temperature anneals and may getter any oxygen that is present in the barrier layer 26.

The materials of the barrier layer 26 and blocking layer 28 may be deposited by, for example, ALD in which the deposition of each atomic layer of spacer material, or a fraction thereof, is controlled by alternating and sequential introduction of appropriate gas phase reactants that combine in a self-limiting manner to incrementally form or build the complete layer in each instance. Suitable gas phase reactants for forming titanium nitride (TiN) as the barrier layer 26 may include a titanium-containing precursor, such as titanium tetrachloride ($TiCl_4$), and ammonia ($NH_3$). Another set of gas phase reactants for forming titanium nitride (TiN) as the barrier layer 26 may include a metalorganic precursor such as tetrakis(dimethylamido)titanium (TDMAT) and $NH_3$. Suitable gas phase reactants for forming titanium silicon nitride (TiSiN) as the blocking layer 28 may include a titanium-containing precursor, such as titanium tetrachloride ($TiCl_4$), a silicon-containing precursor, such as silicon tetrachloride ($SiCl_4$)) or silane ($SiH_4$), and ammonia ($NH_3$). In an embodiment, the barrier layer 26 may have a thickness on the order of 1.5 nanometers, and the blocking layer 28 may have a thickness ranging from 2.5 nanometers to 5 nanometers.

In an embodiment, the barrier layer 26 and the blocking layer 28 may be deposited in situ in the same deposition tool. In an alternative embodiment, the barrier layer 26 and the blocking layer 28 may be deposited ex situ in different deposition tools such that an air break is introduced. While the air break occurs in a non-reactive gas atmosphere (e.g., nitrogen gas ($N_2$)), residual oxygen in the gas atmosphere may be absorbed at the top surface of the barrier layer 26 and incorporated at the interface 27 between the barrier layer 26 and the blocking layer 28.

After the barrier layer 26 and blocking layer 28 are applied and the post-deposition anneal is performed, the interfacial layer 22 and dielectric layer 24 are subjected to additional high-temperature thermal treatments. In an embodiment, a spike anneal may be performed using, for example, a bank of flash lamps at a temperature of 900° C. to 1000° C. followed by a laser spike anneal (LSA) at a temperature of 1150° C. to 1400° C. The blocking layer 28 blocks oxygen in the ambient environment during the high-temperature thermal treatments from being transported through the blocking layer 28 to the interfacial layer 22 and dielectric layer 24. The blocking layer 28 defines a physical barrier to oxygen permeation, and the blocking layer 28 may absorb or getter oxygen attempting to diffuse through the blocking layer 28. The thickness, composition, and the amount of silicon in the blocking layer 28 are exemplary parameters that can be adjusted to optimize the oxygen blocking performance.

Figure 2:
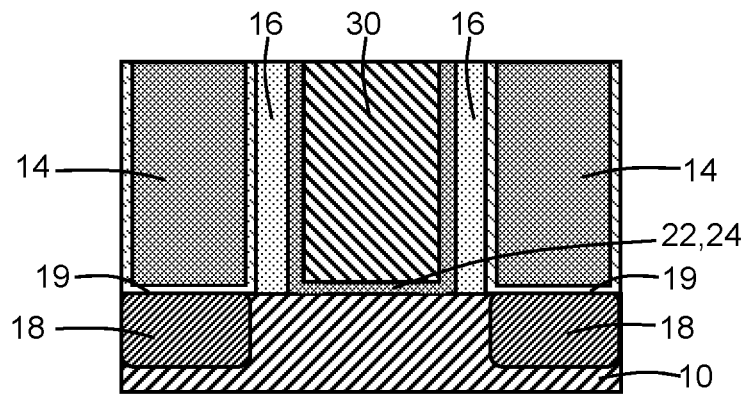
FIG. 2 is a cross-sectional view of the device structure of FIG. 1 at a subsequent stage of the processing method.

With reference to FIG. 2 in which like reference numerals refer to like features in FIGS. 1, 1A and at a subsequent fabrication stage, the barrier layer 26 and blocking layer 28 are removed, following the high-temperature thermal treatments, with an etching process. In an embodiment, a wet chemical etching process may be used that preferentially removes the materials of the barrier layer 26 and blocking layer 28 selective to the material of the dielectric layer 24. For example, suitable etch chemistries for the wet chemical etching process may include a mixture of peroxide with an acid or a base, such as a mixture of water ($H_2O$), hydrogen peroxide ($H_2O_2$), and ammonium hydroxide ($NH_4OH$) (i.e., a SC1 clean), or hot ammonia gas. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

The complete and efficient removal of the blocking layer 28 is facilitated through the selection of constituent material and its composition. Conventional blocking layers composed of amorphous silicon may be difficult to completely remove and/or efficiently remove with conventional wet chemical solutions. In contrast, the blocking layer 28 is readily and completely removable using a wet chemical etching process. In addition, depositing the blocking layer 28 with ALD improves conformality and scalability in comparison with conventional reliability caps that include a layer of amorphous silicon deposited by chemical vapor deposition (CVD).

A gate electrode 30 may be formed in the opening 12 following the removal of the barrier layer 26 and blocking layer 28. The gate electrode 30 may include one or more conformal barrier metal layers and/or work function metal layers composed of conductors, such as metals (e.g., tungsten (W)) and/or metal nitrides or carbides (e.g., titanium nitride (TiN) and titanium aluminum carbide (TiAlC)), deposited by physical vapor deposition (PVD), CVD, ALD, etc. The barrier metal layers and/or work function metal layers of the gate electrode 30 may differ for an n-type field-effect transistor or a p-type field-effect transistor. The conformal barrier metal layers and/or work function metal layers are deposited to fill the opening 12 and then removed from the field area on the interlayer dielectric layer 14 by planarization, such as with chemical-mechanical polishing (CMP). The planarization from the polishing causes the gate electrode 30 and the sidewall spacers 16 to be coplanar with a top surface of the adjacent sections of the interlayer dielectric layer 14.

In a representative embodiment, the dielectric layer 24 is described herein in connection with the formation of a gate electrode 30. However, embodiments of the invention may be more generally applied to any instance in which a cap layer is required for a high-k dielectric material during a high-temperature heat treatment.

Figure 3:
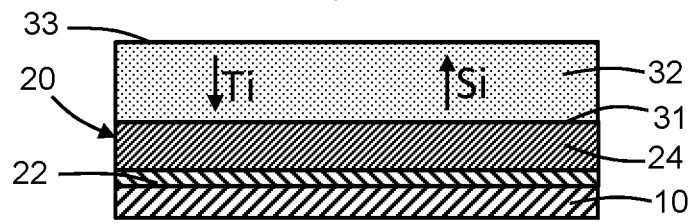
FIG. 3 is a cross-sectional view of the device structure of FIG. 1A in accordance with embodiments of the invention.

With reference to FIG. 3 in which like reference numerals refer to like features in FIG. 1A and at a subsequent fabrication stage, the barrier layer 26 may be omitted and the composition of the blocking layer 28 may be combined into a single blocking layer 32 with enhanced barrier properties. The blocking layer 32 has a graded composition that is generated by adjusting parameters (e.g., exposure times to different reactants) during the ALD process. If composed of titanium silicon nitride (TiSiN), the highest concentration of titanium in the blocking layer 32 may occur near the interface 31 with the dielectric layer 24 and the concentration of titanium may decrease with increasing distance from the interface with the dielectric layer 24 in a direction toward the top surface 33 of blocking layer 32, and the lowest concentration of silicon in the blocking layer 32 may occur near the interface with the dielectric layer 24 and the concentration of silicon may increase with increasing distance from the interface with the dielectric layer 24 in a direction toward the top surface 33 of blocking layer 32. In an embodiment, the peak concentrations of titanium at the interface 31 and at the top surface 33 may fall in a range from 20 at. % to 40 at. % with the higher peak concentration occurring at the interface 31 and a graded composition between these peak concentrations, and the peak concentrations of silicon at the interface 31 and at the top surface 33 may fall in a range from 10 at. % to 30 at. % with the higher concentration occurring at the top surface 33 with a graded composition between these peak concentrations.

The reliability caps described herein may find application in various types of field-effect transistors, such as planar field-effect transistors and fin-type field-effect transistors, as well as gate-all-around designs including horizontal nanosheet field effect transistors and vertical-transport field-effect transistors.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
depositing a first layer comprised of a metal silicon nitride on a high-k dielectric material;
thermally processing the high-k dielectric material in an oxygen-containing ambient environment with the first layer arranged as a cap between the high-k dielectric material and the oxygen-containing ambient environment; and
after the high-k dielectric material is thermally processed, completely removing the first layer with a wet chemical etching process,
wherein the first layer blocks transport of oxygen from the oxygen-containing ambient environment to the high-k dielectric material.

2. The method of claim 1 wherein the metal silicon nitride is titanium silicon nitride (TiSiN).

3. The method of claim 1 wherein the metal silicon nitride includes a metal selected from the group consisting of titanium (Ti), tantalum (Ta) tungsten (W), niobium (Nb), vanadium (V), zirconium (Zr), hafnium (Hf), chromium (Cr), molybdenum (Mo), and combinations thereof.

4. The method of claim 1 further comprising:
depositing a second layer on the high-k dielectric material,
wherein the second layer is arranged between the first layer and the high-k dielectric material, and the second layer is free of silicon.

5. The method of claim 4 wherein the first layer and the second layer are deposited in the same deposition tool, and the second layer is deposited before the first layer is deposited.

6. The method of claim 4 wherein the first layer and the second layer are deposited in different deposition tools with an air break, and the second layer is deposited before the first layer is deposited.

7. The method of claim 1 wherein the high-k dielectric material is a gate dielectric of a field-effect transistor.

8. The method of claim 1 wherein the first layer is in direct contact with the high-k dielectric material along an interface.

9. The method of claim 8 wherein the first layer is deposited with a graded composition that is depleted of silicon at the interface.

10. The method of claim 1 wherein the first layer is deposited by atomic layer deposition.

11. The method of claim 1 wherein thermally processing the high-k dielectric material comprises:
performing a spike anneal, a soak anneal, and/or a laser spike anneal targeting the high-k dielectric material,
wherein the high-k dielectric material is arranged on a semiconductor layer containing silicon.

12. The method of claim 1 further comprising:
after completely removing the first layer, forming a gate electrode on the high-k dielectric material.

13. The method of claim 1 wherein the first layer has an amorphous structure.

14. The method of claim 1 wherein the metal silicon nitride of the first layer is removed by the wet chemical etching process selective to the high-k dielectric material.

15. The method of claim 8 wherein the metal silicon nitride of the first layer has a concentration of silicon that increases with increasing distance in the first layer from the interface.

16. The method of claim 15 wherein the metal silicon nitride is titanium silicon nitride, and the metal silicon nitride of the first layer has a concentration of titanium that decreases with increasing distance in the first layer from the interface.

* * * * *